United States Patent
Lee et al.

(10) Patent No.: US 7,414,551 B2
(45) Date of Patent: Aug. 19, 2008

(54) ENCODING AND DECODING METHODS AND APPARATUSES FOR RECORDING SYSTEM

(75) Inventors: Jun Lee, Yongin-si (KR); Kyong-mi Lee, Seoul (KR)

(73) Assignees: Samsung Electronics Co., Ltd., Suwon-si (KR); Institute for Information Technology Advancement, Daejeon (KR)

( * ) Notice: Subject to any disclaimer, the term of this patent is extended or adjusted under 35 U.S.C. 154(b) by 738 days.

(21) Appl. No.: 10/945,045

(22) Filed: Sep. 21, 2004

(65) Prior Publication Data

US 2005/0062623 A1  Mar. 24, 2005

(30) Foreign Application Priority Data

Sep. 22, 2003 (KR) .................. 10-2003-0065540

(51) Int. Cl.
*H03M 7/00* (2006.01)

(52) U.S. Cl. .................. 341/107; 341/50; 341/51; 341/59

(58) Field of Classification Search .......... 341/107, 341/59, 51, 50, 81, 58; 714/755, 786; 360/46; 375/232

See application file for complete search history.

(56) References Cited

U.S. PATENT DOCUMENTS

| | | | | |
|---|---|---|---|---|
| 5,220,466 A * | 6/1993 | Coker et al. | ............... | 360/46 |
| 5,537,112 A * | 7/1996 | Tsang | ............... | 341/59 |
| 5,550,683 A * | 8/1996 | Koren | ............... | 360/46 |
| 5,579,340 A * | 11/1996 | Tokuriki et al. | ............... | 375/232 |
| 6,046,691 A * | 4/2000 | Aziz et al. | ............... | 341/58 |
| 6,072,410 A * | 6/2000 | Kim | ............... | 341/81 |
| 6,154,870 A * | 11/2000 | Fredrickson et al. | ............... | 714/786 |
| 6,388,587 B1 * | 5/2002 | Brickner et al. | ............... | 341/59 |
| 6,400,288 B1 * | 6/2002 | Fredrickson et al. | ............... | 341/59 |
| 2002/0057640 A1 * | 5/2002 | Hattori et al. | ............... | 369/59.24 |
| 2003/0101402 A1 * | 5/2003 | Amrani et al. | ............... | 714/755 |

FOREIGN PATENT DOCUMENTS

| | | |
|---|---|---|
| JP | 08-167251 A | 6/1996 |
| JP | 2001-053623 A | 2/2001 |
| KR | 2001-0109461 A | 12/2001 |

OTHER PUBLICATIONS

Mittelholzer T et al:, "Channel precoding and low-density parity-check codes for magnetic recording", Proceedings 2003 IEEE International Symposium on Information Theory. ISIT 03. Yokohama, Japan Jun. 29-Jul. 4, 2003, IEEE International Symposium on Information Theory, New York, NY :IEEE, US, Jun. 29, 2003, p. 47, XP010657075.

Jing Li et al:, "On the performance of turbo product codes and LDPC codes over partial-response channels", ICC 2001. 2001 IEEE International Conference on Communications. Conference Record. Helsinky, Finland, Jun. 11-14, 2001, IEEE International Conference on Communications, New York, NY :IEEE, US, vol. 1 of 10, Jun. 11, 2001, pp. 2176-2183, XP010553703.

* cited by examiner

*Primary Examiner*—Jean B Jeanglaude
(74) *Attorney, Agent, or Firm*—Sughrue Mion, PLLC

(57) ABSTRACT

A method and apparatus for encoding and decoding data for a recording system. The method of encoding data involves encoding input data into a predetermined code and precoding the predetermined code so that output levels of a channel can be detected, the channel being defined by a predetermined channel polynomial.

33 Claims, 5 Drawing Sheets

ENCODING AND DECODING METHODS AND APPARATUSES FOR RECORDING SYSTEM

BACKGROUND OF THE INVENTION

This application claims the priority of Korean Patent Application No. 2003-65540, filed on Sep. 22, 2003, in the Korean Intellectual Property Office, the disclosure of which is incorporated herein in its entirety by reference.

1. Field of the Invention

The present invention relates to data encoding and decoding methods and apparatuses for a recording system, an more particularly, to data encoding and decoding methods and apparatuses that have great performance even at a low signal-to-noise ratio.

2. Description of the Related Art

As the integration density or recording systems increases, the signal-to-noise ratio of signals read from the recording systems decreases. Therefore, data detectors for high-density recording systems are now required to have better detection performance than their conventional counterparts. There are a few reliable conventional data detecting methods, i.e., a partial response maximum likelihood method, a noise-predictive maximum likelihood method, and a low-density parity check (LDPC) method, which has better performance than a turbo code decoding method in terms of approaching the Shannon limit.

An LDPC code is a linear block code that encodes data by using an LDPC matrix most of whose elements are "0"s. The performance of the LDPC code is considerably dependent upon the size of the LDPC matrix and the pattern of distribution of "1"s in the LDPC matrix. The LDPC code is decoded using a probability propagation method, which is also known as a belief propagation algorithm.

In order to decode the LDPC code, a likelihood function should be calculated first. In order to calculate the likelihood function, input data should be a signal whose output levels are detectable. However, it is difficult to detect output levels of a signal output from a partial response (PR) equalizer that compensates for a signal reproduced from a recording system, i.e., an output level of a PR channel.

This problem also applies to a turbo-like system used for improving the performance of a storage system. A conventional turbo-like system adopts different decoding techniques for an outer code and an inner code. For example, the conventional turbo-like system uses an LDPC code decoding method to decode an outer code and uses a partial response maximum likelihood (PRML) or non-parametric maximum likelihood (NPML) method to decode an inner code, and the reason is as follows. An LDPC code decoder should receive a signal with detectable output levels as input data so as to perform an LDPC code decoding process. However, as described above, output levels of a signal output from a PR equalizer, i.e., output levels of a PR channel, are hard to detect, which makes it difficult to form the conventional turbo-like system of LDPC codes only in a PR channel.

More specifically, since the output levels of the PR channel are hard to detect, an LDPC code is only used as an outer code. However, due to the characteristics of the LDPC code, a likelihood function should be calculated as a-priori information before decoding the LDPC code. In order to calculate the likelihood function, extrinsic information should be provided from an outer code to an inner code, and the output levels of the PR channel should also be provided. However, the output levels of the PR channel cannot be easily detected and are not provided to the outer code. Therefore, the outer code has to calculate the likelihood function by only using the extrinsic information. Accordingly, the LDPC code decoder may not be able to precisely calculate the likelihood function, and the extrinsic information provided from the outer code to the inner code may be inaccurate.

SUMMARY OF THE INVENTION

Exemplary embodiments of the present invention provide methods and apparatuses for encoding and decoding data, which encode and precode input data so that channel output levels can be detected, and detect data from the channel output levels.

Also, exemplary embodiments of the present invention provide turbo-like encoding and decoding apparatuses, which turbo-encode and precode input data so that channel output levels can be detected, and detect data from the channel output levels.

According to an exemplary embodiment of the present invention, there is provided a method of encoding data. The method involves encoding input data into a predetermined code; and precoding the predetermined code so that output levels of a channel can be detected, the channel being defined by a predetermined channel polynomial.

According to another exemplary embodiment of the present invention, there is provided a method of decoding data after receiving, via a predetermined channel, a precoded signal obtained by encoding input data into a predetermined code and preceding the predetermined code with the use of a predetermined channel polynomial so that output levels of the predetermined channel can be detected. The method involves receiving the precoded signal via the predetermined channel and obtaining a channel output for the precoded signal; and decoding the channel output by using a predetermined decoding algorithm.

According to another exemplary embodiment of the present invention, there is provided a method of encoding and decoding data. The method involves encoding input data into a predetermined code; preceding the predetermined code so that output levels of a channel can be detected, the channel being defined by a predetermined channel polynomial; receiving a precoded signal, which is obtained by preceding the predetermined code, via the predetermined channel and obtaining a channel output for the precoded signal; and decoding the channel output by using a predetermined decoding algorithm.

According to another exemplary embodiment of the present invention, there is provided a method of decoding data after receiving, via a predetermined channel, a precoded signal obtained by encoding input data into a predetermined code and preceding the predetermined code with the use of a predetermined channel polynomial so that output levels of the predetermined channel can be detected. The method involves receiving the precoded signal via the predetermined channel and obtaining a channel output for the precoded signal; receiving first extrinsic information and the channel output and decoding the channel output for the precoded signal by using a first decoding algorithm; and receiving the channel output for the precoded signal and second extrinsic information obtained as a result of decoding the channel output for the precoded signal, decoding the channel output for the precoded signal by using a second decoding algorithm, and providing the first extrinsic information.

According to another exemplary embodiment of the present invention, there is provided a method of encoding and decoding data. The method involves encoding input data into a predetermined code; preceding the predetermined code so that an output level of a channel can be detected, the channel being defined by a predetermined channel polynomial; receiving a precoded signal, obtained by preceding the predetermined code, via the predetermined channel and obtaining a channel output for the precoded signal; receiving first extrinsic information and the channel output for the precoded signal and decoding the channel output for the precoded signal by using a first decoding algorithm; and receiving second extrinsic information obtained as a result of decoding the channel output for the precoded signal and the channel output for the precoded signal, decoding the channel output for the precoded signal by using a second decoding algorithm, and providing the first extrinsic information.

According to another exemplary embodiment of the present invention, there is provided an apparatus for encoding and decoding data. The apparatus includes an encoder, which encodes input data into a predetermined code; a precoder, which precodes the predetermined code so that an output level of a channel can be detected, the channel being defined by a predetermined channel polynomial; a channel equalizer, which receives the precoded code via the predetermined channel and obtains an output of the predetermined channel for the precoded code; and a decoder, which decodes the output of the predetermined channel by using a predetermined decoding algorithm.

According to another exemplary embodiment of the present invention, there is provided an apparatus for encoding and decoding data. The apparatus includes an encoder, which encodes input data into a predetermined code; a precoder, which precodes the predetermined code so that output levels of a channel can be detected, the channel being defined by a predetermined channel polynomial; a channel equalizer, which receives the precoded signal via the predetermined channel and obtains a channel output for the precoded signal; a first decoder, which receives first extrinsic information and the channel output and decodes the channel output by using a first decoding algorithm; and a second decoder, which receives second extrinsic information obtained as a result of decoding the channel output and the channel output, decodes the channel output by using a second decoding algorithm, and provides the first extrinsic information to the first decoder.

According to another exemplary embodiment of the present invention, there is provided an apparatus for encoding and decoding data. The apparatus includes a first encoder, which encodes input data into a first code; a second encoder, which encodes the input data into a second code; a multiplexer, which multiplexes the input data and the first and second codes; a precoder, which precodes a code output from the multiplexer so that output levels of a channel can be detected, the channel being defined by a predetermined channel polynomial; a channel equalizer, which receives a precoded signal, which is obtained by precoding the code, via the predetermined channel and obtains a channel output for the precoded code; a first decoder, which receives first extrinsic information and the channel output and decodes the channel output by using a first decoding algorithm; and a second decoder, which receives second extrinsic information obtained as a result of decoding the channel output and the channel output, decodes the channel output by using a second decoding algorithm, and provides the first extrinsic information to the first decoder.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
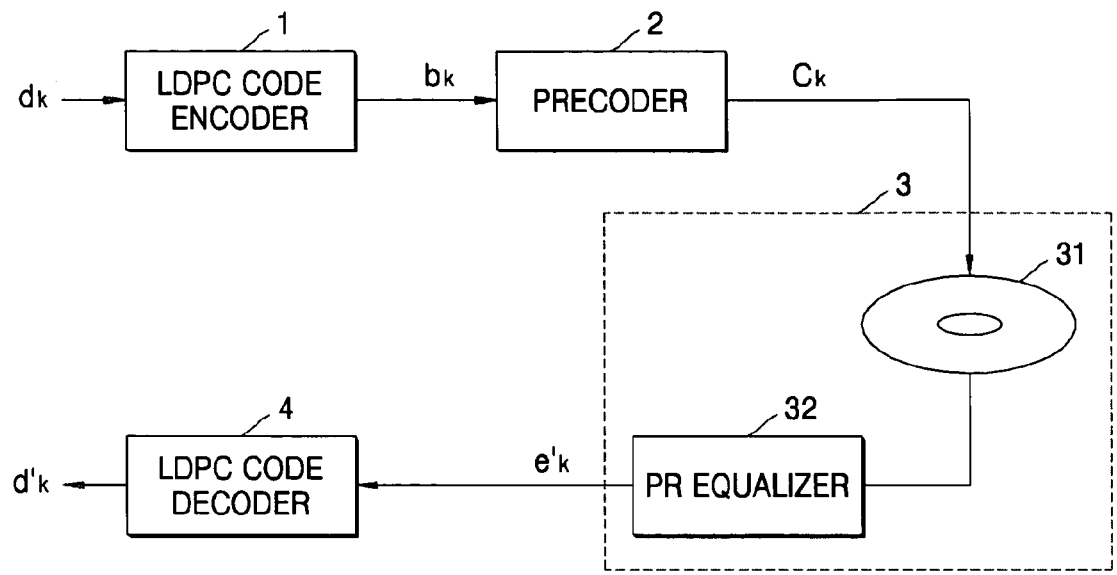
FIG. 1 is a block diagram of an apparatus for encoding and decoding data according to an exemplary embodiment of the present invention.

FIG. 1 is a block diagram of an apparatus for encoding and decoding data according to an exemplary embodiment of the present invention. Referring to FIG. 1, the apparatus includes a low-density parity check (LDPC) code encoder 1, a precoder 2, a partial response (PR) channel 3, and an LDPC code decoder 4. The PR channel 3 comprises a recording medium 31 and a PR equalizer 32. The PR channel 3 can be represented by an arbitrary polynomial having integers as its coefficients. A combination of the precoder 2 and the PR channel 3 is called a precoded channel.

The performance of the apparatus for encoding and decoding data may be determined through a bit error rate (BER) test that compares original data with data obtained by encoding the original data and decoding the encoded data.

The LDPC code encoder 1 encodes data $d_k$ by using an LDPC matrix. The precoder 2 precodes encoded data $b_k$ received from the LDPC code encoder 1 by using a predetermined precoding function so that an output level of the PR channel 3 can be detected. The precoded data is recorded on the recording medium 31. The PR equalizer 32 reduces noise of a reproduced signal output from the recording medium 31 and outputs a PR channel signal $e'_k$ with detectable output levels. The LDPC code decoder 4 recovers original data $d_k'$ from the PR channel signal $e'_k$.

A polynomial PR(D) representing the PR channel 3 may be defined as follows:

$$PR(D) = 1 + a_1 D + \ldots + a_n D^n \quad (1)$$

where each of $a_1 \ldots a_n$ is an integer, n is an integer, and D represents delay.

The precoding function P(D) associated with the polynomial PR(D) shown in Equation (1) may be defined as follows:

$$P(D) = \frac{1}{1 \oplus \text{MOD}(a_1, 2)D \oplus \ldots \oplus \text{MOD}(a_n, 2)D^n} \quad (2)$$

where $\text{MOD}(a_n, 2)$ indicates a signed remainder of $a_n$ divided by 2, and $\oplus$ indicates a logical exclusive OR operation.

Polynomials representing different PR channels and their respective precoding functions and respective sets of PR channel signals are shown in Table 1 below.

TABLE 1

| PR(D) | P(D) | Set of PR Channel Signal Levels | |
|---|---|---|---|
| | | 0 | 1 |
| PR4(1, 0, −1) | $\dfrac{1}{1 \oplus D^2}$ | 0 | ±2 |
| Extended PR4(1, 1, −1, −1) | $\dfrac{1}{1 \oplus D \oplus D^2 \oplus D^3}$ | 0, ±4 | ±2 |

In a case where (1, 0, −1) are given as coefficients of a polynomial representing a PR4 channel, as shown in Table 1, a corresponding precoding function for the precoder 2 is $$\frac{1}{1 \oplus D^2}.$$

Figure 2:
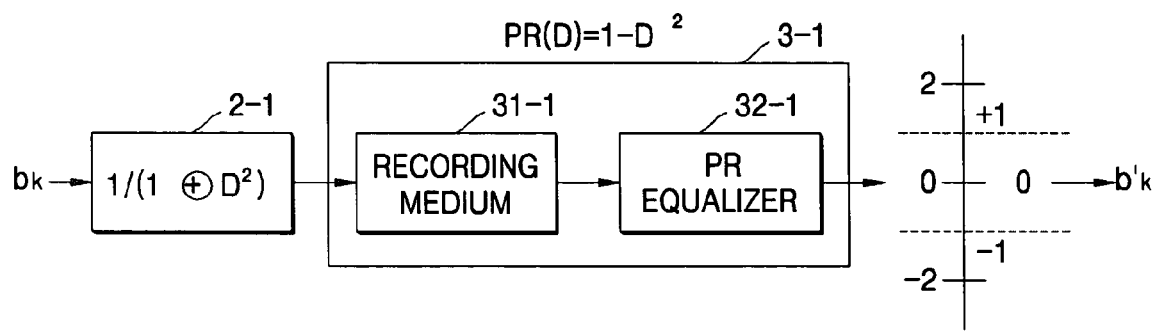
FIG. 2 is diagram illustrating a precoded partial response (PR) 4 channel in a case where (1, 0, −1) are given as coefficients of a polynomial representing the precoded PR4 channel.

FIG. 2 illustrates a process of obtaining an output of a precoded PR4 channel in a case where (1, 0, −1) is given as coefficients of a polynomial representing the precoded PR4 channel, i.e., in a case where the polynomial representing the precoded PR4 channel is $PR(D)=1-D^2$. Referring to FIG. 2, an input symbol $b_k$ is precoded by a precoder 2-1. A PR equalizer 32-1 outputs a value or a set of values corresponding to the PR channel 3-1, i.e., 0 or ±2, by using a signal output from a recording medium 31-1. Since ±2 is a set of PR channel signals obtained when $b_k=1$ and 0 is a PR channel signal obtained when $b_k=0$, 0 or 1 is obtained as a recovered symbol $b'_k$ for the value(s) output from the PR equalizer 32-1 (i.e., 0 or ±2).

The LDPC code decoder 4 receives the PR channel signal $e'_k$ and recovers original data $d'_k$. More specifically, in order to decode an LDPC code, a likelihood function $f_k^i$, which is a function of the probability of the data $b_k$ input to the precoder 2 being determined as i (where i is 0 or 1) when the output of the PR equalizer 32-1 is $e'_k$, should be given as a-priori information. The likelihood function $f_k^i$ may be defined by the following equation: $f_k^i = P(b_k=i|e'_k)$. Since a typical likelihood function for LDPC codes is generally derived using a binary phase shift keying (BPSK) modulation method, it is necessary to modify the typical likelihood function to be compatible with the PR channel 3 of the present invention. A BPSK channel has two signals, and a PR channel has more than two signals. According to Bayes' theorem, the likelihood function $f_k^i$ can be derived by Equation (3) below:

$$f_k^i = P(b_k = i \mid e'_k) = \frac{\sum_j [P(b_k = i) P(e'_k \mid Y = S_j(i))]}{\sum_i \sum_j [P(b_k = i) P(e'_k \mid Y = S_j(i))]} \quad (3)$$

where $S_j(i)$ indicates a j-th set of noiseless PR channel signals that make $b_k$ equal to i, $P(e'_k|Y=S_j(i))$ indicates channel transition probability of a k-th PR channel signal, calculated by using a probability density function of a given PR channel, $P(b_k=i)$ indicates a-priori probability, i=0 or 1, and $1 \leq j \leq L-1$ (where L indicates the number of PR channel signals).

Here, the channel transition probability $P(e'_k|Y=S_j(i))$ may be increased or decreased by using a weight factor and may affect performance gains. Supposing that the precoded PR channel is an additive white Gaussian noise channel (AWGN) channel, $S_j(1)=\pm2(1 \leq j \leq 2)$ and $S_j(0)=0(j=1)$. In this case, the channel transition probability $P(e'_k|Y=S_j(i))$ may be expressed by Equation (4) below:

$$P(e'_k \mid Y = S_j(i)) = \exp\left[-w\frac{(e'_k - S_j(i))^2}{2\sigma^2}\right] \quad (4)$$

where w indicates a weight factor, and $\sigma^2$ indicates a noise variance.

The weight factor w may vary from channel to channel and may be determined experimentally.

Figure 3:
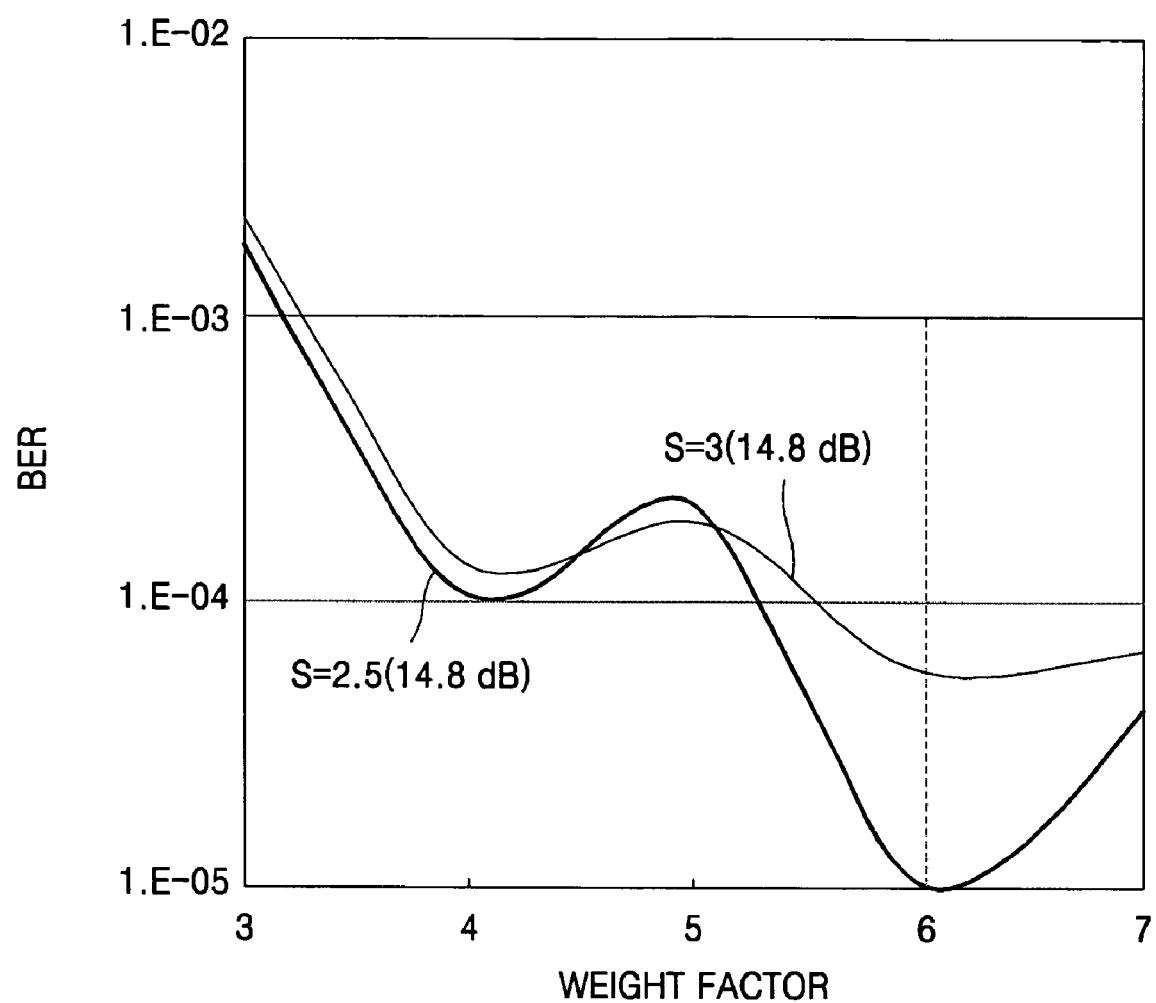
FIG. 3 is a diagram illustrating the variations of bit error rate (BER) with respect to a weight factor when a normalized recording density S is 2.5 and when the normalized recording density is 3.

FIG. 3 illustrates the variations of BER with respect to a weight factor when normalized recording density S is 2.5 and when the normalized recording density S is 3. Referring to FIG. 3, BER reaches its minimum when the weight factor w is 6, regardless of whether the normalized recording density is 2.5 or 3. Therefore, in the present embodiment, the weight factor w may be set to 6.

When i=0 or 1, the likelihood function $f_k^i$ for the PR channel 3 may be also defined by Equations (5) below:

$$f_k^0 = \frac{1}{1 + \exp\left[\frac{2w(e'_k - 1)}{\sigma^2 + L_{ext}(k)}\right]} + \exp\left[\frac{-2w(e'_k + 1)}{\sigma^2 + L_{ext}(k)}\right] \quad (5)$$

$$L_{ext}(k) = \ln\left[\frac{P(b_k = 1)}{P(b_k = 0)}\right]$$

$$f_k^1 = 1 - f_k^0$$

The LDPC code decoder 4 decodes the PR channel signal $e'_k$ using a probability propagation algorithm by referring to the likelihood function $f_k^i$ of Equation (3) or (5).

Figure 4:
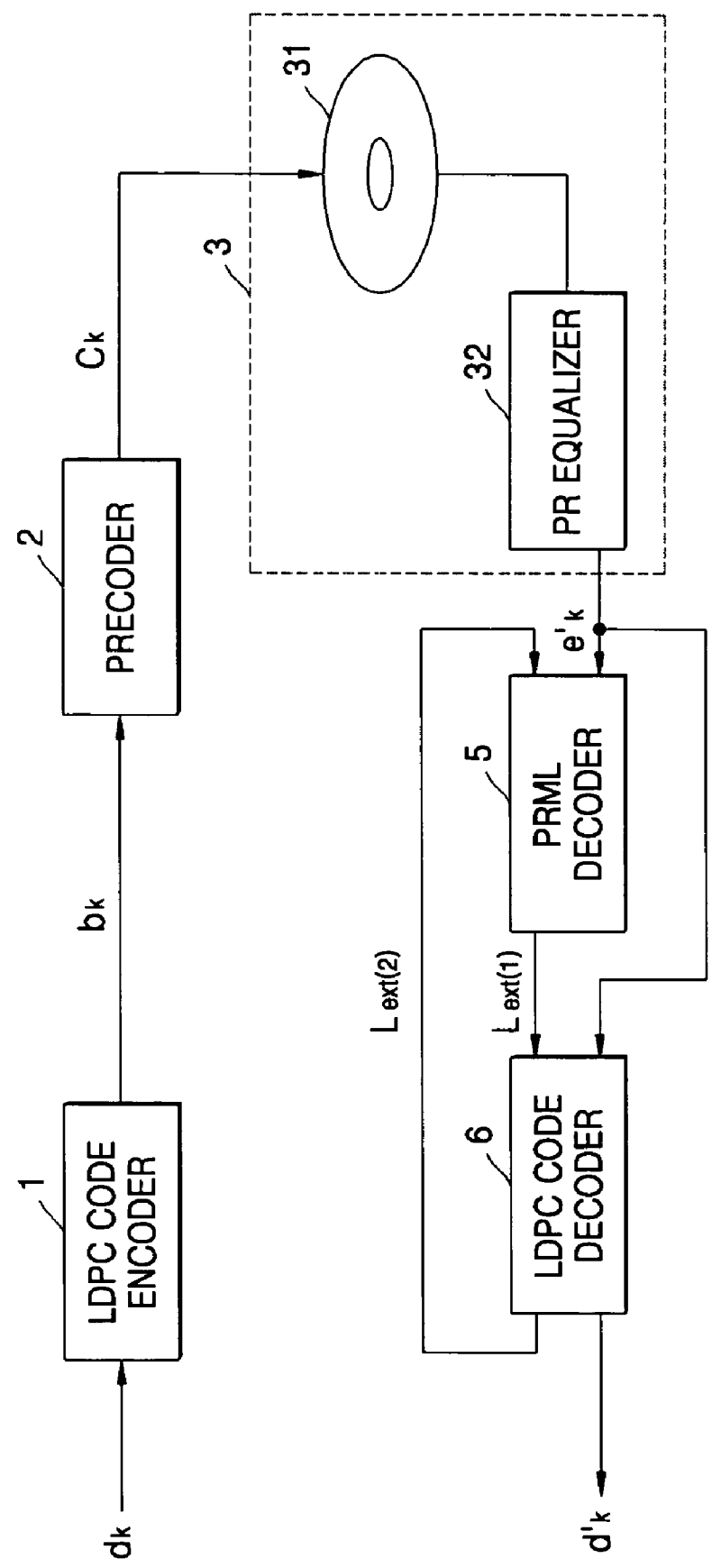
FIG. 4 is a block diagram of an apparatus for encoding and decoding data according to another exemplary embodiment of the present invention.

FIG. 4 is a block diagram of an apparatus for encoding and decoding data according to another exemplary embodiment of the present invention. Referring to FIG. 4, the apparatus includes an LDPC code encoder 1, a precoder 2, a PR channel 3, which includes a recording medium 31 and a PR equalizer 32, a partial response maximum likelihood (PRML) decoder 5, and an LDPC code decoder 6.

In FIGS. 1 and 4, like reference numerals represent like elements, and thus their descriptions will be omitted. Therefore, only the operations of the PRML decoder 5 and the LDPC code decoder 6 will now be described.

The PRML decoder 5 and the LDPC code decoder 6 decode a PR channel signal $e'_k$ recursively and iteratively. The PRML decoder 5, which can be replaced by a non-parametric maximum likelihood (NPML) decoder, PRML-decodes the PR channel signal $e'_k$ by using extrinsic information $L_{ext}(2)$ fed back thereto from the LDPC code decoder 6, and the LDPC code decoder 6 recovers original data $d'_k$ from the PR channel signal $e'_k$ based on extrinsic information $L_{ext}(1)$ output from the PRML decoder 5 by using a probability propagation method.

$L_{ext}(1)$ and $L_{ext}(2)$ may be expressed by Equations (6) and (7), respectively, below:

$$L_{ext(1)} = L_{PRML} - L_{ext(2)} \quad (6)$$

$$L_{ext(2)} = L_{LDPC} - L_{ext(1)} - \ln\frac{\sum_j [P(e'_k \mid Y = S_j(1))]}{\sum_j [P(e'_k \mid Y = S_j(0))]} \quad (7)$$

where $L_{PRML}$ and $L_{LDPC}$ are log-likelihood ratios (LLRS) of a-posteriori probabilities of the PRML decoder 5 and the LDPC code decoder 6 and are provided to the LDPC code decoder 6 and the PRML decoder 5, respectively, as the a-priori information. A third term of the right side of Equation (7) indicates an LLR of channel transition probability. The channel transition probability, as described above, may be increased or decreased by a using a weight factor.

Figure 5:
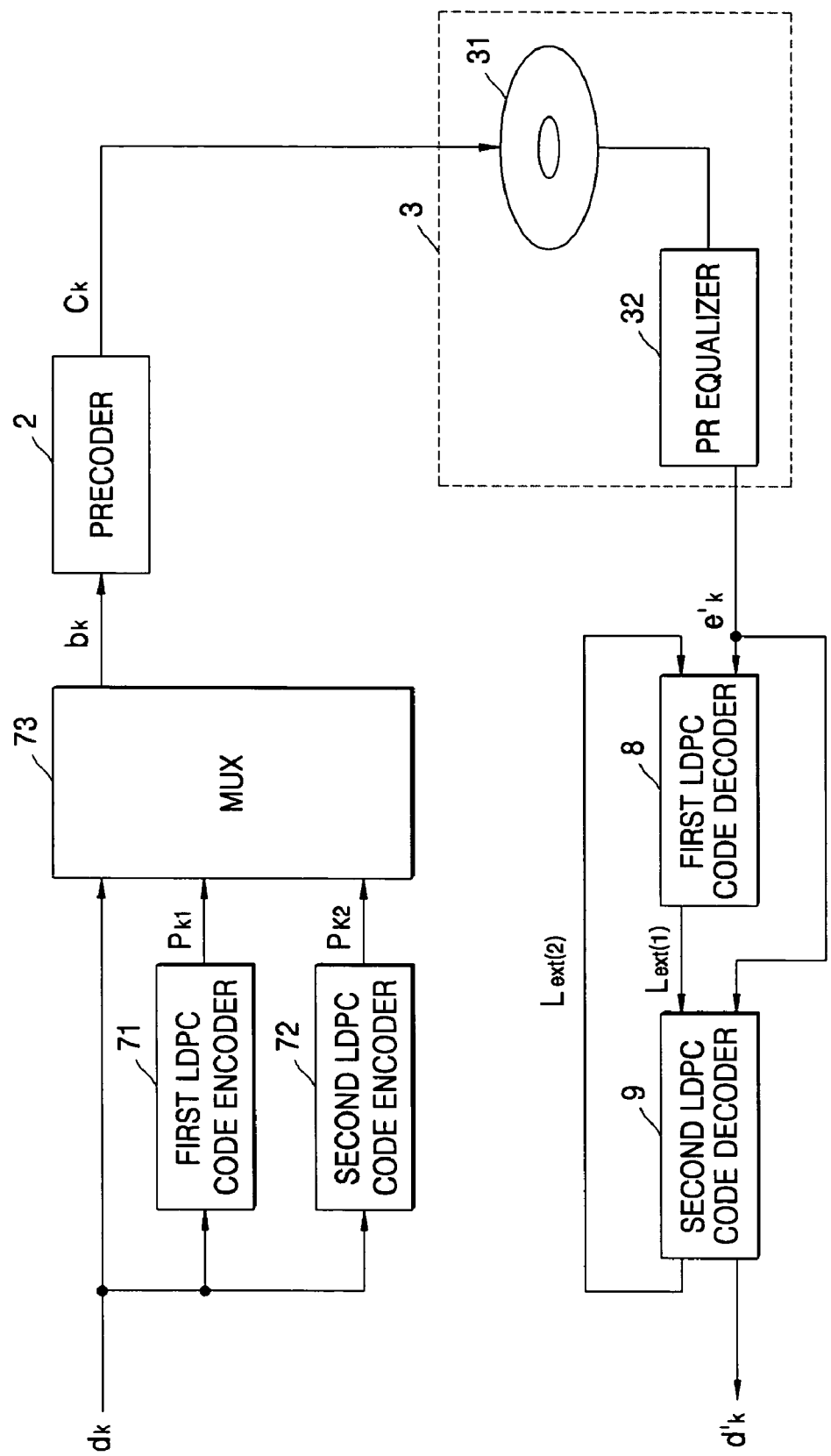
FIG. 5 is a block diagram of an apparatus for encoding and decoding data according to still another exemplary embodiment of the present invention.

FIG. 5 is a block diagram of an apparatus for encoding and decoding data according to still another exemplary embodiment of the present invention. Referring to FIG. 5, the apparatus has the structure of a turbo-like system. The apparatus includes a first LDPC code encoder 71, a second LDPC code encoder 72, a multiplexer 73, a precoder 2, a PR channel 3, which includes a recording medium 31 and a PR equalizer 32, a first LDPC code decoder 8, and a second LDPC code decoder 9.

The precoder 2, the recording medium 31, and the PR equalizer 32 are the same as their respective counterparts of FIG. 1, and thus their descriptions will be skipped.

The first and second LDPC code encoders 71 and 72 encode data $d_k$ input thereto into LDPC codes $P_{k1}$ and $P_{k2}$, respectively, and the multiplexer 73 performs a multiplexing process by concatenating the LDPC codes $P_{k1}$ and $P_{k2}$ with the input data $d_k$ in parallel.

The first and second LDPC encoders 71 and 72 encode the input data $d_k$ using different regular parity check matrices. When each row and column of the parity check matrix have a predetermined number of "1"s arranged regularly, an LDPC code is considered regular. Otherwise, the LDPC code is considered irregular. Therefore, the first and second LDPC encoders 71 and 72 form an irregular code. Given all this, an interleaver is not necessary in the present embodiment.

The first and second LDPC code decoders 8 and 9 are the same as the PRML decoder 5 and the LDPC code decoder 6, respectively, of FIG. 4 except that the first LDPC code decoder 8 uses a different decoding algorithm and a different method of calculating extrinsic information from the PRML decoder 5 of FIG. 4.

In the present embodiment, extrinsic information $L_{ext(1)}$ and $L_{ext(2)}$ is calculated by Equations (7).

$$L_{ext(1)} = L_{LDPC(1)} - L_{ext(2)} - \ln \frac{\sum_j [P(e'_k | Y = S_j(0))]}{\sum_j [P(e'_k | Y = S_j(0))]} \quad (7)$$

$$L_{ext(2)} = L_{LDPC(2)} - L_{ext(2)} - \ln \frac{\sum_j [P(e'_k | Y = S_j(0))]}{\sum_j [P(e'_k | Y = S_j(0))]}$$

Figure 6A:
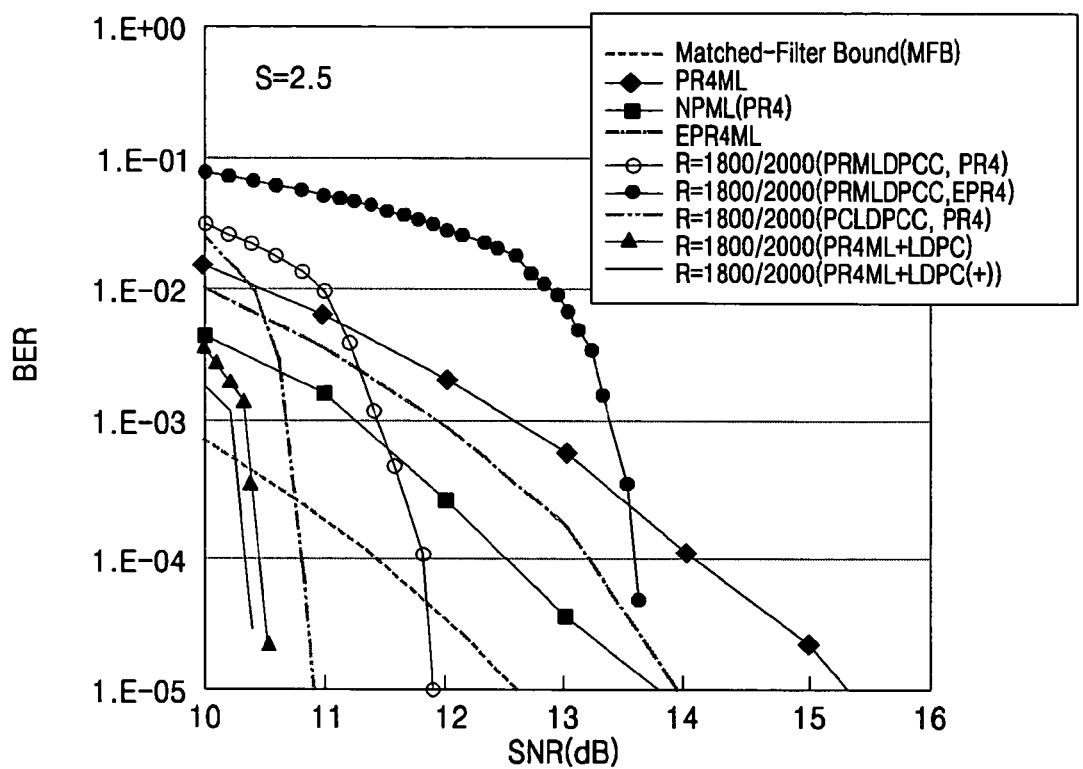
FIGS. 6A and 6B are diagrams illustrating the variations of BER with respect to signal-to-noise ratio (SNR), respectively obtained by using the prior art and exemplary embodiments of the present invention.
Figure 6B:
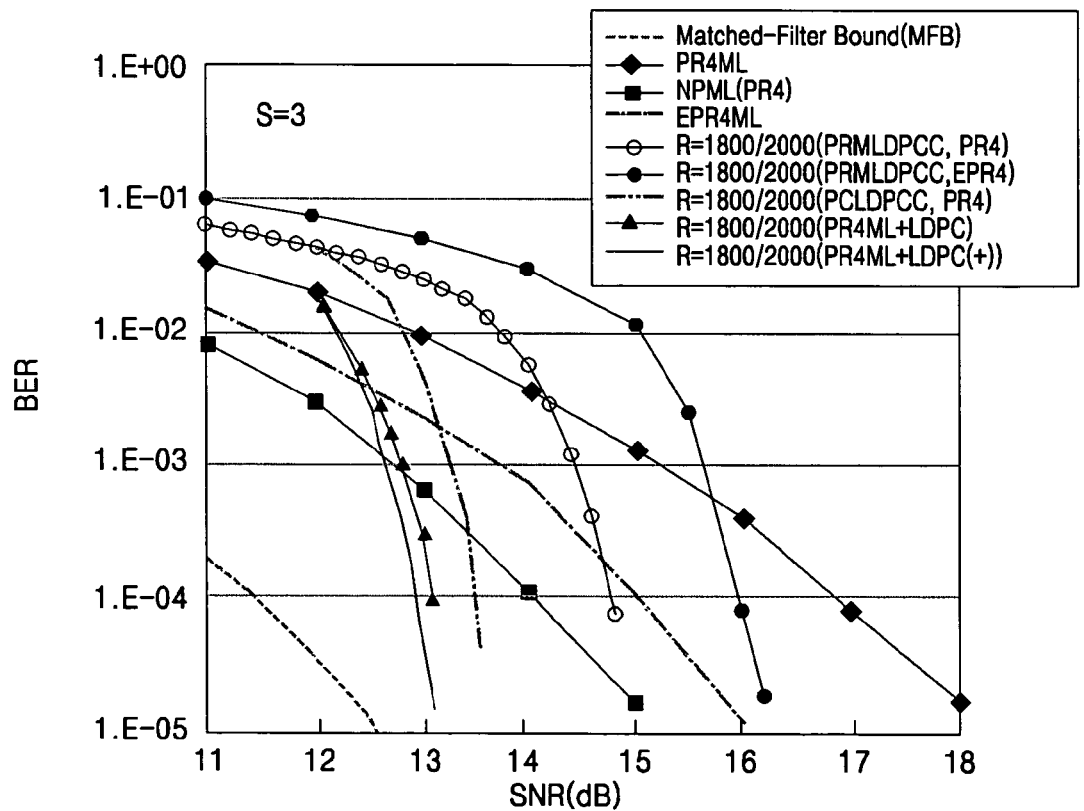

FIGS. 6A and 6B are diagrams illustrating the variations of BER with respect to signal-to-noise ratio (SNR), respectively obtained by using the prior art and exemplary embodiments of the present invention. More specifically, FIG. 6A illustrates the variations of BER with respect to signal-to-noise ratio (SNR), respectively obtained by using conventional apparatuses for encoding and decoding data and the apparatuses of FIGS. 1, 4, and 5 when the normalized recording density S is 2.5, and FIG. 6B illustrates the variations of BER with respect to signal-to-noise ratio (SNR), respectively obtained by using conventional apparatuses for encoding and decoding data and the apparatuses of FIGS. 1, 4, and 5 when the normalized recording density S is 3. In FIGS. 6A and 6B, a Lorentzian channel or longitudinal recording channel is used, and PR targets are PR4 and enhanced PR4 (EPR4) channels.

The number of LDPC code iterations is 40, and a total number of LDPC decoding iterations is 5. A weight factor is 6, and SNR is $$10 \log_{10} \sum_k \frac{A^2}{\sigma^2}$$

where $A^2$ represents channel response power. In FIGS. 6A and 6B, R represents encoding rate, PRMLDPCC stands for partial response matched LDPC code and represents the apparatus of FIG. 1, PCLDPCC stands for parallel-concatenated LDPC code and represents such a turbo-like system as the apparatus of FIG. 5, and PR4ML+LDPC(+) represents the apparatus of FIG. 4. As shown in FIGS. 6A and 6B, PRMLDPCC has an SNR gain of 2-4 dB at a BER of $10^{-5}$, compared to PRML or NPML. The performance of PRMLDPCC, unlike that of PRML, deteriorates as the order of a PR target increases because a higher-order PR target generates a large number of PR channel signals than a lower-order PR target, and the more PR channel signals there are, the more likely they are to malfunction. It is safe to say that PCLDPCC also has better performance than the prior art.

In FIGS. 6A and 6B, PRML+LDPC represents a conventional apparatus for encoding and decoding apparatus (H. Song et al., in IEEE Trans. Magn. 36, p. 2183, 2000) in which an output of a PR equalizer is not input to an LDPC code decoder. As shown in FIG. 6A and 6B, PR4ML+LDPC(+), which indicates the apparatus of FIG. 4, has an SNR gain of 0.2 dB at a BER of $10^{-5}$, compared to PR4ML+LDPC, regardless of channel density.

According to the exemplary embodiments of the present invention, data is precoded in a PR channel so that channel response output levels can be detected, and the detected channel response output levels are directly input to an LDPC code decoder. Therefore, it is possible to enhance BER even in an environment with a low SNR. Thus, the present invention is suitable for a high density recording system and is also applicable to a communications system using a PR channel.

What is claimed is:

1. A method of encoding data comprising:
   encoding input data into a predetermined code; and
   precoding the predetermined code so that output levels of a channel can be detected, the channel being defined by a predetermined channel polynomial,
   wherein the predetermined code is precoded by using a precoding function P(D) defined as follows:

$$P(D) = \frac{1}{1 \oplus \text{MOD}(a_1, 2)D \oplus \ldots \oplus \text{MOD}(a_n, 2)D^n}$$

where $\text{MOD}(a_n, 2)$ indicates a signed remainder of $a_n$ divided by 2, and $\oplus$ indicates a logical exclusive OR operation.

2. The method of claim 1, wherein the channel is a partial response channel.

3. The method of claim 2, wherein the predetermined channel polynomial PR(D) is defined as follows:

$$PR(D) = 1 + a_1 D + \ldots + a_n D^n$$

where each of $a_1 \ldots a_n$ indicates an integer, n is an integer and D indicates delay.

4. An apparatus for encoding and decoding data comprising:
   an encoder which encodes input data into a predetermined code;
   a precoder which precodes the predetermined code so that output levels of a channel can be detected, the channel being defined by a predetermined channel polynomial;
   a channel equalizer which receives the precoded signal via the predetermined channel and obtains a channel output for the precoded signal;
   a first decoder which receives first extrinsic information and the channel output and decodes the channel output by using a first decoding algorithm; and
   a second decoder which receives second extrinsic information obtained as a result of decoding the channel output and the channel output, decodes the channel output by using a second decoding algorithm, and provides the first extrinsic information to the first decoder.

5. The apparatus of claim 4, wherein the predetermined channel polynomial PR(D) is defined as follows:

$$PR(D) = 1 + a_1 D + \ldots + a_n D^n$$

where each of $a_1 \ldots a_n$ indicates an integer, n is an integer and D indicates delay, and
the precoder precodes the predetermined code by using a precoding function P(D) defined as follows:

$$P(D) = \frac{1}{1 \oplus \mathrm{MOD}(a_1, 2)D \oplus \ldots \oplus \mathrm{MOD}(a_n, 2)D^n}$$

where $\mathrm{MOD}(a_n, 2)$ indicates a signed remainder of $a_n$ divided by 2, and $\oplus$ indicates a logical exclusive OR operation.

6. The apparatus of claim 4, wherein the second decoder determines the first extrinsic information by using a-priori information, obtained with the use of a predetermined decoding algorithm, the second extrinsic information, and a log-likelihood ratio for the channel transition probability.

7. The apparatus of claim 4, wherein the first decoder determines the second extrinsic information by using the first extrinsic information and the a-priori information.

8. A method of decoding data after receiving, via a predetermined channel, a precoded signal obtained by encoding input data into a predetermined code and precoding the predetermined code with the use of a predetermined channel polynomial so that output levels of the predetermined channel can be detected, the method comprising:
   receiving the precoded signal via the predetermined channel and obtaining a channel output for the precoded signal; and
   decoding the channel output by using a probability propagation algorithm that uses the channel output as an input and calculates a probability of the predetermined code outputting the channel output as a-priori information and decodes the channel output by using the a-priori information,
   wherein the probability $f_k^i$ of the predetermined code outputting the channel output is defined as follows:

$$f_k^i = P(b_k = i \mid e_k') = \frac{\sum_j [P(b_k = i)P(e_k' \mid Y = S_j(i))]}{\sum_i \sum_j [P(b_k = i)P(e_k' \mid Y = S_j(i))]}$$

where $e_k'$ indicates the channel output, $S_j(i)$ indicates a j-th set of noiseless PR channel signals that make $b_k$ equal to i, $P(e_k' \mid Y=S_j(i))$ indicates channel transition probability of a k-th PR signal, $P(b_k=i)$ indicates a-priori probability, i=0 or 1, and $1 \leq j \leq L-1$, where L indicates the number of PR channel signals.

9. The method of claim 8, wherein the channel transition probability $P(e_k' \mid Y=S_j(i))$ is defined as follows:

$$P(e_k' \mid Y = S_j(i)) = \exp\left[-w \frac{(e_k' - S_j(i))^2}{2\sigma^2}\right]$$

where w indicates a weight factor, and $\sigma^2$ indicates a noise variance.

10. A method of encoding and decoding data comprising:
    encoding input data into a predetermined code;
    precoding the predetermined code so that output levels of a channel can be detected, the channel being defined by a predetermined channel polynomial;
    receiving a precoded signal, which is obtained by precoding the predetermined code, via the predetermined channel and obtaining a channel output for the precoded signal; and
    decoding the channel output by using a predetermined decoding algorithm,
    wherein the predetermined code is precoded by using a precoding function P(D) defined as follows:

$$P(D) = \frac{1}{1 \oplus \mathrm{MOD}(a_1, 2)D \oplus \ldots \oplus \mathrm{MOD}(a_n, 2)D^n}$$

where $\mathrm{MOD}(a_n, 2)$ indicates a signed remainder of $a_n$ divided by 2 and $\oplus$ indicates a logical exclusive OR operation.

11. The method of claim 10, wherein the predetermined channel polynomial PR(D) is defined as follows:

$$PR(D) = 1 + a_1 D + \ldots + a_n D^n$$

where each of $a_1 \ldots a_n$ indicates an integer, n is an integer and D indicates delay.

12. The method of claim 11, wherein the decoding algorithm is a probability propagation algorithm that uses the channel output as an input.

13. The method of claim 12, wherein the decoding algorithm calculates a probability of the predetermined code outputting the channel output as a-priori information and decodes the channel output by using the a-priori information.

14. The method of claim 13, wherein the probability $f_k^i$ of the predetermined code outputting the channel output is defined as follows:

$$f_k^i = P(b_k = i \mid e_k') = \frac{\sum_j [P(b_k = i)P(e_k' \mid Y = S_j(i))]}{\sum_i \sum_j [P(b_k = i)P(e_k' \mid Y = S_j(i))]}$$

where $e_k'$ indicates the channel output, $S_j(i)$ indicates a j-th set of noiseless PR channel signals that make bk equal to i, $P(e_k' \mid Y=S_j(i))$ indicates channel transition probability of a k-th PR signal, $P(b_k=i)$ indicates a-priori probability, i=0 or 1, and $1 \leq j \leq L-1$, where L indicates the number of PR channel signals.

15. The method of claim 14, wherein the channel transition probability $P(e'_k|Y=S_j(i))$ is defined as follows:

$$P(e'_k | Y = S_j(i)) = \exp\left[-w\frac{(e'_k - S_j(i))^2}{2\sigma^2}\right]$$

where w indicates a weight factor and $\sigma^2$ indicates a noise variance.

16. A method of decoding data after receiving, via a predetermined channel, a precoded signal obtained by encoding input data into a predetermined code and precoding the predetermined code with the use of a predetermined channel polynomial so that output levels of the predetermined channel can be detected, the method comprising:
receiving the precoded signal via the predetermined channel and obtaining a channel output for the precoded signal;
receiving first extrinsic information and the channel output and decoding the channel output for the precoded signal by using a first decoding algorithm; and
receiving the channel output for the precoded signal and second extrinsic information obtained as a result of decoding the channel output for the precoded signal, decoding the channel output for the precoded signal by using a second decoding algorithm, and providing the first extrinsic information.

17. The method of claim 16, wherein the second extrinsic information is determined by the first extrinsic information and a-priori information obtained by using the first decoding algorithm.

18. The method of claim 16, wherein the first extrinsic information is determined by a-priori information, the second extrinsic information, and a log-likelihood ratio for the channel transition probability.

19. A method of encoding and decoding data comprising:
encoding input data into a predetermined code;
precoding the predetermined code so that an output level of a channel can be detected, the channel being defined by a predetermined channel polynomial;
receiving a precoded signal, obtained by precoding the predetermined code, via the predetermined channel and obtaining a channel output for the precoded signal;
receiving first extrinsic information and the channel output for the precoded signal and decoding the channel output for the precoded signal by using a first decoding algorithm; and
receiving second extrinsic information obtained as a result of decoding the channel output for the precoded signal and the channel output for the precoded signal, decoding the channel output for the precoded signal by using a second decoding algorithm, and providing the first extrinsic information.

20. The method of claim 19, wherein the second extrinsic information is determined by the first extrinsic information and a-priori information obtained by using the first decoding algorithm.

21. The method of claim 19, wherein the predetermined channel polynomial PR(D) is defined as follows:

$PR(D)=1+a_1D+\ldots+a_nD^n$ where each of $a_1 \ldots a_n$ indicates an integer, n is an integer and D indicates delay.

22. The method of claim 21, wherein the predetermined code is precoded by using a precoding function P(D) defined as follows:

$$P(D) = \frac{1}{1 \oplus \text{MOD}(a_1, 2)D \oplus \ldots \oplus \text{MOD}(a_n, 2)D^n}$$

where $\text{MOD}(a_n, 2)$ indicates a signed remainder of $a_n$ divided by 2, and $\oplus$ indicates a logical exclusive OR operation.

23. The method of claim 19, wherein the first extrinsic information is determined by a-priori information, the second extrinsic information, and a log-likelihood ratio for the channel transition probability.

24. An apparatus for encoding and decoding data comprising:
an encoder which encodes input data into a predetermined code;
a precoder which precodes the predetermined code so that an output level of a channel can be detected, the channel being defined by a predetermined channel polynomial;
a channel equalizer which receives the precoded code via the predetermined channel and obtains an output of the predetermined channel for the precoded code; and
a decoder which decodes the output of the predetermined channel by using a predetermined decoding algorithm,
wherein the precoder precodes the predetermined code by using a precoding function P(D) defined as follows:

$$P(D) = \frac{1}{1 \oplus \text{MOD}(a_1, 2)D \oplus \ldots \oplus \text{MOD}(a_n, 2)D^n}$$

where $\text{MOD}(a_n, 2)$ indicates a signed remainder of $a_n$ divided by 2, and $\oplus$ indicates a logical exclusive OR operation.

25. The apparatus of claim 24, wherein the predetermined channel polynomial PR(D) is defined as follows:

$PR(D)=1+a_1D+\ldots+a_nD^n$ where each of $a1 \ldots a_n$ indicates an integer, n is an integer, D indicates delay.

26. The apparatus of claim 25, wherein the decoder receives the channel output and decodes the channel output by using a probability propagation algorithm.

27. The apparatus of claim 26, wherein the decoder calculates, as a-priori information, probability $f_k^i$ of the predetermined code outputting the channel output and decodes the channel output by using the a-priori information, and the probability $f_k^i$ is defined as follows:

$$f_k^i = P(b_k = i | e'_k) = \frac{\sum_j [P(b_k = i)P(e'_k | Y = S_j(i))]}{\sum_i \sum_j [P(b_k = i)P(e'_k | Y = S_j(i))]}$$

where $e'_k$ indicates the channel output, $S_j(i)$ indicates a j-th set of noiseless PR channel signals making $b_k$ equal to i, $P(e'_k|Y=S_j(i))$ indicates channel transition probability of a k-th PR signal, $P(b_k=i)$ indicates a-priori probability, i=0 or 1, and $1 \leq j \leq L-1$, where L indicates the number of PR channel signals.

28. The apparatus of claim 27, wherein the decoder defines channel transition probability $P(e'_k|Y=S_j(i))$ as follows:

$$P(e'_k \mid Y = S_j(i)) = \exp\left[-w\frac{(e'_k - S_j(i))^2}{2\sigma^2}\right]$$

where w indicates a weight factor and $\sigma^2$ indicates a noise variance.

29. An apparatus for encoding and decoding data comprising:
- a first encoder which encodes input data into a first code;
- a second encoder which encodes the input data into a second code;
- a multiplexer which multiplexes the input data and the first and second codes;
- a precoder which precodes a code output from the multiplexer so that output levels of a channel can be detected, the channel being defined by a predetermined channel polynomial;
- a channel equalizer which receives a precoded signal, which is obtained by precoding the code, via the predetermined channel and obtains a channel output for the precoded code;
- a first decoder which receives first extrinsic information and the channel output and decodes the channel output by using a first decoding algorithm; and
- a second decoder which receives second extrinsic information obtained as a result of decoding the channel output and the channel output, decodes the channel output by using a second decoding algorithm, and provides the first extrinsic information to the first decoder.

30. The apparatus of claim 29, wherein the predetermined channel polynomial PR(D) is defined as follows:

$$PR(D) = 1 + a_1 D + \ldots + a_n D^n$$

where each of $a_1 \ldots a_n$ indicates an integer, n is an integer and D indicates delay, and the precoder precodes the predetermined code by using a precoding function P(D) defined as follows:

$$P(D) = \frac{1}{1 \oplus \text{MOD}(a_1, 2)D \oplus \ldots \oplus \text{MOD}(a_n, 2)D^n}$$

where $\text{MOD}(a_n, 2)$ indicates a signed remainder of $a_n$ divided by 2, and $\oplus$ indicates a logical exclusive OR operation.

31. The apparatus of claim 29, wherein the second decoder determines the first extrinsic information by using a-priori information, obtained with the use of a predetermined decoding algorithm, the second extrinsic information, and a log-likelihood ratio for the channel transition probability.

32. The apparatus of claim 29, wherein the first decoder determines the second extrinsic information by using the first extrinsic information, the a-priori information, and a log-likelihood ratio for the channel transition probability.

33. The apparatus of claim 29, wherein the first and second encoders encode the input data using different encoding algorithms so as to make an interleaver unnecessary.

* * * * *